(12) United States Patent
Mizoguchi (10) Patent No.: US 8,884,721 B2
(45) Date of Patent: Nov. 11, 2014

(54) LAMINATED LC FILTER

(75) Inventor: Naoki Mizoguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 376 days.

(21) Appl. No.: 13/290,179

(22) Filed: Nov. 7, 2011

(65) Prior Publication Data

US 2012/0112856 A1 May 10, 2012

(30) Foreign Application Priority Data

Nov. 9, 2010 (JP) ................................. 2010-251291

(51) Int. Cl.
*H03H 7/09* (2006.01)
*H03H 7/01* (2006.01)
*H03H 1/00* (2006.01)

(52) U.S. Cl.
CPC ............... *H03H 7/09* (2013.01); *H03H 7/1775* (2013.01); *H03H 2001/0057* (2013.01); *H03H 2001/0085* (2013.01)
USPC .......................................................... 333/185

(58) Field of Classification Search
USPC .......................................................... 333/185
See application file for complete search history.

(56) References Cited

U.S. PATENT DOCUMENTS

| | | | | |
|---|---|---|---|---|
| 6,147,573 | A | * | 11/2000 | Kumagai et al. ............... 333/185 |
| 6,222,427 | B1 | | 4/2001 | Kato et al. |
| 2009/0309683 | A1 | * | 12/2009 | Cochran ........................ 336/65 |

FOREIGN PATENT DOCUMENTS

| | | |
|---|---|---|
| JP | 03-274814 A | 12/1991 |
| JP | 09-035936 A | 2/1997 |
| JP | 10-190391 A | 7/1998 |
| JP | 11-026241 A | 1/1999 |
| JP | 2002-252117 A | 9/2002 |
| JP | 2005-340586 A | 12/2005 |
| JP | 2009-246889 A | 10/2009 |

OTHER PUBLICATIONS

Machine translation of JP 11-026241, translated May 29, 2014.*
Official Communication issued in corresponding Japanese Patent Application No. 2010-251291, mailed on Dec. 11, 2012.

* cited by examiner

*Primary Examiner* — Stephen Jones
*Assistant Examiner* — Scott S Outten
(74) *Attorney, Agent, or Firm* — Keating & Bennett, LLP

(57) ABSTRACT

A substantially loop-shaped inductor including a via electrode is arranged such that its loop surface is parallel to a mounting board. Thus, a direction of magnetic flux of the inductor is perpendicular to the mounting board, and influence of the magnetic flux on an adjacent electronic component is significantly reduced and minimized. In addition, the via electrode defines a principal portion of the inductor. Thus, an inductor with a great Q value is obtained, and the insertion loss of a laminated LC filter is significantly reduced and minimized.

5 Claims, 9 Drawing Sheets

LAMINATED LC FILTER

BACKGROUND OF THE INVENTION

1. Field of the Invention

The present invention relates to a laminated LC filter preferably for use in an electronic device or other suitable device, for example.

2. Description of the Related Art

An existing laminated LC filter is composed of a laminate in which a dielectric layer and an electrode layer are laminated; and a plurality of LC resonators provided in the laminate.

Figure 9:
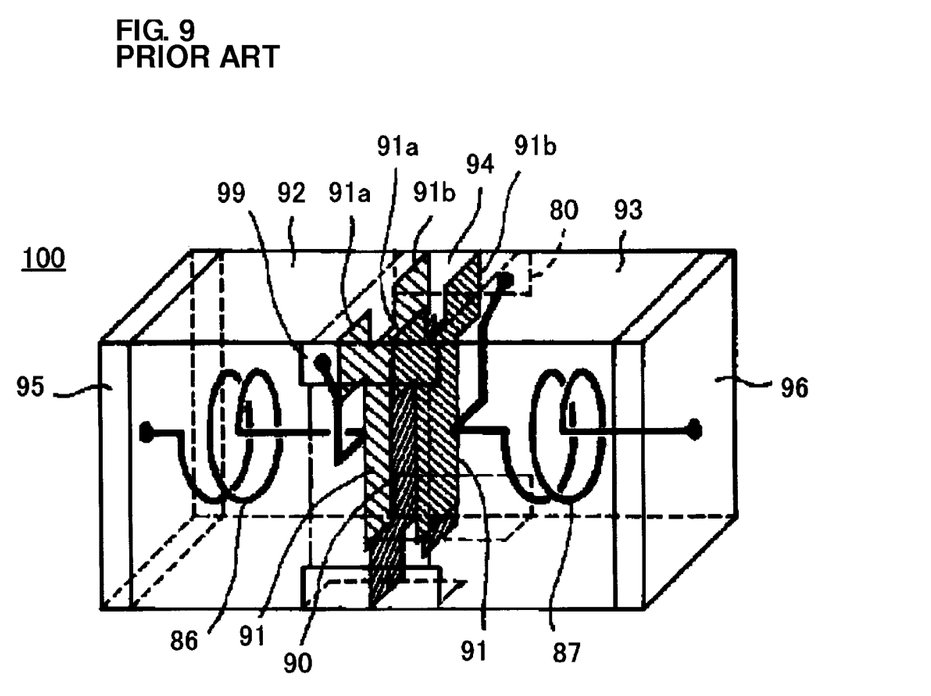
FIG. 9 is a diagram illustrating an existing laminated LC filter.

For example, an LC filter 100 disclosed in Japanese Unexamined Patent Application Publication No. 10-190391 as shown in FIG. 9 is known. Specifically, the LC filter 100 includes inductor portions 92 and 93 in which coils 86 and 87 are included, respectively. Each of the coils 86 and 87 is formed by laminating sheets in which coil conductors and via electrodes for defining a relay are provided, and their axial directions are perpendicular to input/output external electrodes 95 and 96. In addition, a ground electrode 90 and an electrode 91 are disposed in a capacitor portion 94 so as to face each other.

An end of the coil 86 is electrically connected to an end 91a of the electrode 91 via a connection electrode 99 provided on a side surface of the filter 100 on the near side. An end of the coil 87 is electrically connected to the other end 91b of the electrode 91 via a connection electrode 80 provided on a side surface of the filter 100 on the far side.

However, in the LC filter disclosed in Japanese Unexamined Patent Application Publication No. 10-190391, the directions of magnetic fields of the coils 86 and 87 are parallel to a board on which the LC filter is mounted. Thus, radiation of magnetic flux influences an adjacent electronic component. In addition, the coil conductors are mainly formed of pattern printing electrodes, and hence an inductance with a great Q value is not obtained. Thus, the insertion loss of the filter increases.

SUMMARY OF THE INVENTION

In view of the circumstances described above, preferred embodiments of the present invention provide an LC filter in which the direction of a magnetic field is perpendicular to a board on which the LC filter is mounted, thereby reducing the influence of radiation of magnetic flux on an adjacent electronic component, and in which an inductance with a great Q value is obtained to provide low loss.

According to a preferred embodiment of the present invention, a laminated LC filter includes a laminate including a plurality of dielectric layers, a capacitor electrode layer, an inductor electrode layer, a ground electrode layer, an input/output electrode layer, and a via electrode extending through the dielectric layers in a thickness direction thereof, and having a substantially rectangular parallelepiped shape; and an LC resonator that includes a capacitor including the capacitor electrode layer and an inductor including the inductor electrode layer. The inductor includes the inductor electrode layer and the via electrode extending through the plurality of dielectric layers in the thickness direction, and preferably has a substantially loop shape. The capacitor preferably includes the ground electrode layer and the capacitor electrode layer located so as to face the ground electrode layer. The input/output electrode layer is located on an outermost surface that faces in a lamination direction of the laminate.

According to the above configuration, the loop-shaped inductor has a structure such that the via electrode is a principal body. Thus, an inductor with a great Q value can be obtained, and as a result, it is possible to reduce the insertion loss of the filter.

In the laminated LC filter, preferably, a magnetic layer is located on a surface perpendicular to a direction of a magnetic field of the inductor among surfaces of the laminate.

According to the above configuration, the inductance of the inductor of the laminated LC filter can be increased. In addition, the magnetic layer prevents spreading of the magnetic field of the inductor, and in a device in which the laminated LC filter is mounted, influence of the magnetic field on an adjacent electronic component can be reduced. Moreover, the magnetic layer has an effect of mechanically reinforcing the laminated LC filter, due to its rigidity, and thus strength against inter-layer separation of the laminate and cracking caused by bending or the like can be increased.

In the laminated LC filter, preferably, a magnetic layer is arranged so as to extend through a loop surface of the loop-shaped inductor.

According to the above configuration, the inductance of the inductor of the laminated LC filter can be increased. In addition, the magnetic layer prevents spreading of the magnetic field of the inductor, and in a device in which the laminated LC filter is mounted, influence of the magnetic field on an adjacent electronic component can be reduced.

In the laminated LC filter, preferably, the LC resonator includes two or more LC resonators of which adjacent LC resonators are coupled to each other, and a magnetic layer is provided between the loop-shaped inductors of the adjacent LC resonators.

According to the above configuration, due to an effect of the magnetic layer preventing spreading of magnetic flux, the magnetic layer has an effect of weakening electromagnetic coupling between the inductors and can be used to adjust the electromagnetic coupling therebetween.

In the laminated LC filter, preferably, a surface parallel to the lamination direction among surfaces of the laminate is a bottom surface.

According to the above configuration, the magnetic field of the loop-shaped inductor is directed so as to be radiated from the center of the loop, and its direction is perpendicular to a board on which the laminated LC filter is mounted. Thus, influence of radiation of magnetic flux on an adjacent electronic component can be prevented and minimized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings.

First Preferred Embodiment

Figure 1:
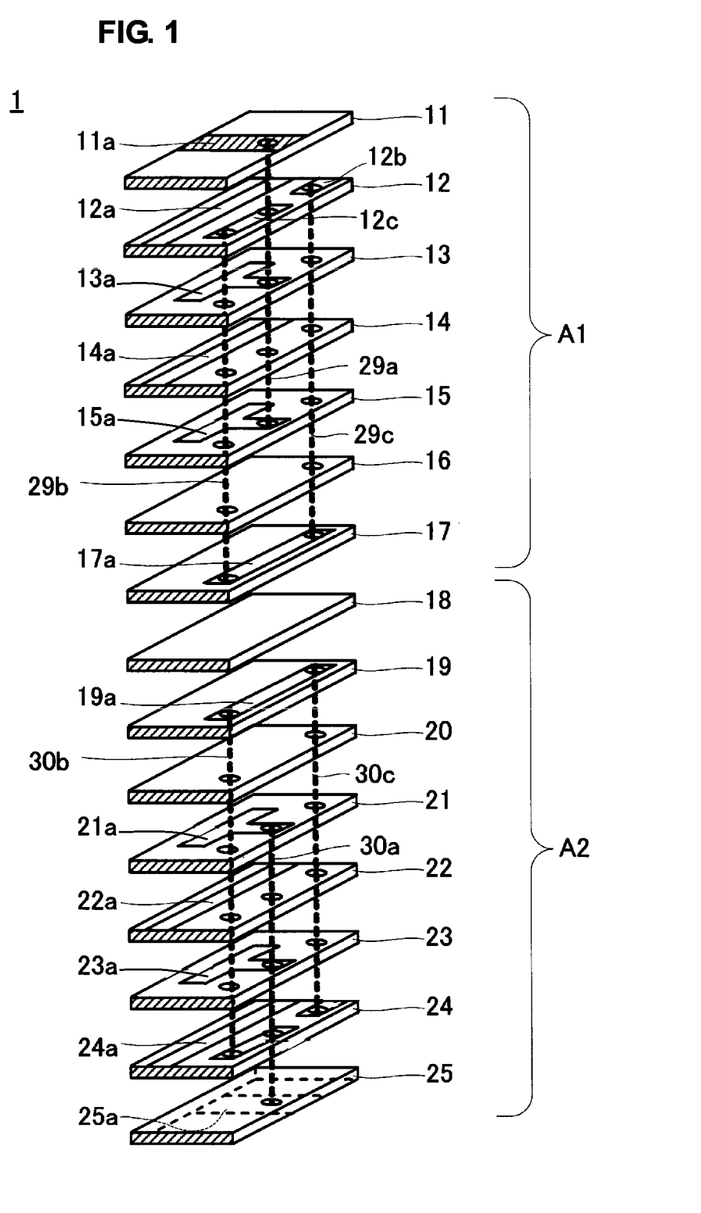
FIG. 1 is an exploded perspective view of a laminate of a laminated LC filter according to a first preferred embodiment of the present invention.
Figure 2A:
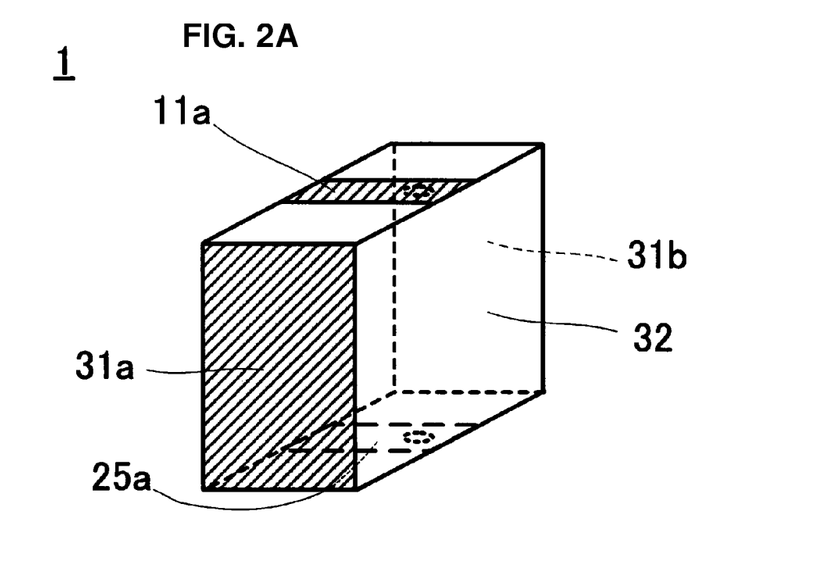
FIGS. 2A and 2B are external perspective views of the laminated LC filter in FIG. 1.
Figure 2B:
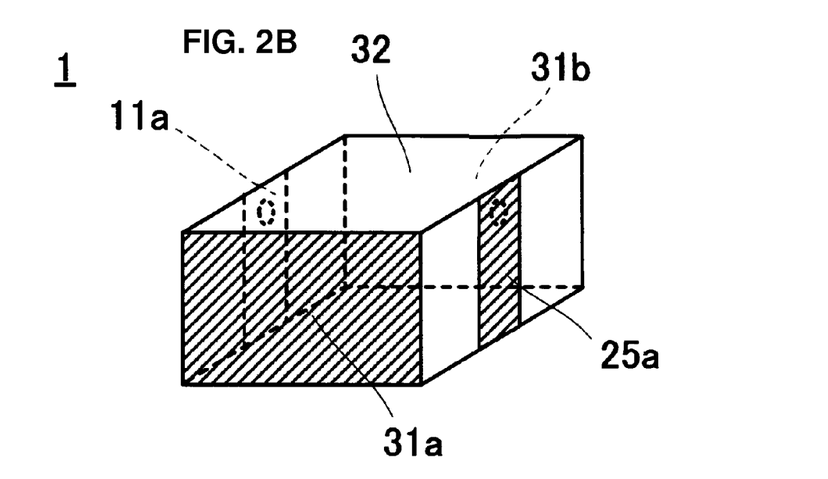

FIG. 1 is an exploded perspective view of a laminated LC filter 1 of the first preferred embodiment. FIG. 2A is an external perspective view of the laminated LC filter 1 in FIG. 1, and FIG. 2B is an external perspective view of the laminated LC filter in a state where a board (not shown) on which the laminated LC filter is mounted is located on the lower side. In FIGS. 1 to 2B, conductive films exposed to the outside are hatched.

As shown in FIG. 1, in the laminated LC filter 1 of the present preferred embodiment, a plurality of dielectric layers and electrode layers are laminated, and via electrodes extend through the dielectric layers. In all of these dielectric layers, ground electrodes are located on surfaces (hatched portions) thereof on the near side in FIG. 1 and surfaces opposed to these surfaces. The ground electrodes on the surfaces on the near side define an electrode 31a in FIGS. 2A and 2B.

The dielectric layers 11-25 are produced, for example, preferably by applying a slurry of a ceramic dielectric material containing alumina and glass as principal components, onto a film by a doctor blade method.

The electrode layers 11a-15a, 17a, 19a, and 21a-25a are formed, for example, preferably by applying a photosensitive conductive paste onto the dielectric layers by a spin coat method or the like and using a photolithographic method. Alternatively, these layers may be formed by screen printing a conductive paste directly onto the dielectric layers.

Hereinafter, the laminated LC filter 1, specifically, the configurations of the laminated dielectric layers and the electrode layer and the via electrodes formed in each dielectric layer will be described in detail.

The laminated LC filter 1 preferably includes two LC resonators having the same configurations and coupled to each other. In FIG. 1, the layers from the uppermost dielectric layer 11 to the dielectric layer 17 constitute a first block A1, and the layers from the dielectric layer 18 to the lowermost dielectric layer 25 constitute a second block A2.

First, the first block A1 will be described.

In the dielectric layer 11, the input/output electrode 11a and a portion of a via electrode 29a are provided and connected to each other.

In the dielectric layer 12, the ground electrodes 12a and 12b, the inductor electrode 12c, and portions of the via electrodes 29a, 29b, and 29c are provided. The ground electrode 12a is connected to the external ground electrodes 31a and 31b, the ground electrode 12b is connected to the via electrode 29c and the external ground electrode 31b, and the inductor electrode 12c is connected to the via electrodes 29a and 29b.

In the dielectric layer 13, the capacitor electrode 13a and portions of the via electrodes 29a, 29b, and 29c are provided. The capacitor electrode 13a is connected to the via electrode 29a.

In the dielectric layer 14, the ground electrode 14a and portions of the via electrodes 29a, 29b, and 29c are provided. The ground electrode 14a is connected to the external ground electrodes 31a and 31b.

In the dielectric layer 15, the capacitor electrode 15a and portions of the via electrodes 29a, 29b, and 29c are provided. The capacitor electrode 15a is connected to the via electrode 29a.

In the dielectric layer 16, portions of the via electrodes 29b and 29c are provided.

In the dielectric layer 17, the inductor electrode 17a and portions of the via electrodes 29b and 29c are provided. The inductor electrode 17a is connected to the via electrodes 29b and 29c.

The ground electrode 12a, the capacitor electrode 13a, the ground electrode 14a, and the capacitor electrode 15a are laminated on the dielectric layers 12 to 15 in order from above. The two capacitor electrodes 13a and 15a are connected to each other via the via electrode 29a to constitute a first capacitor.

Further, in the dielectric layers 12 to 17, a first inductor preferably includes a substantially loop-shaped line that extends from a connection point between the inductor electrode layer 12c and the via electrode 29a through the inductor electrode layer 12c, the via electrode 29b, the inductor electrode layer 17a, and the via electrode 29c in order, to a connection point between the via electrode 29c and the ground electrode layer 12b. As shown in FIG. 2B, when seen in an arrangement in which the laminated LC filter is mounted on a mounting board, the via electrodes extend sequentially through the dielectric layers in parallel to the mounting surface to define the inductor.

In the second block A2 in FIG. 1, dielectric layers 19-25, and electrode layers 19 and 21a-25a are laminated so as to be symmetrical to the first block A1 with respect to the dielectric layer 18, and via electrodes 30a, 30b, and 30c are formed, to constitute a second capacitor and an inductor. As shown in FIG. 1, the lowermost layer 25 is disposed in an orientation in which the uppermost layer 11 of the first block A1 is reversed. In addition, between the first block A1 and the second block A2, a third capacitor preferably includes the inductor electrode layers 17a and 19a.

Figure 3:
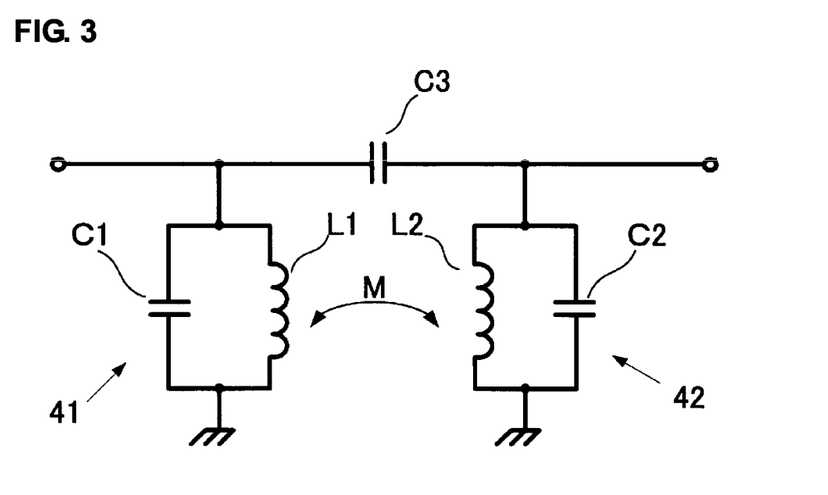
FIG. 3 is an equivalent circuit diagram of the laminated LC filter in FIG. 1.

FIG. 3 is an equivalent circuit diagram of the laminated LC filter 1.

In FIG. 3, a capacitor C1 corresponds to the first capacitor, and an inductor L1 corresponds to the first inductor. Thus, the first capacitor C1 and the first inductor L1 constitute a first LC resonator 41. Similarly, a capacitor C2 and an inductor L2 correspond to the second capacitor and a second inductor, respectively, and constitute a second LC resonator 42. Further, a capacitor C3 corresponds to the third capacitor.

The first LC resonator 41 and the second LC resonator 42 are electromagnetically coupled to each other via the first inductor L1 and the second inductor L2.

When the laminated LC filter 1 comes into an operating state, the first and second inductors generate magnetic fields in directions perpendicular to the loop surfaces thereof. In other words, the directions of the magnetic fields are perpendicular to a lamination direction of the laminate, and are the right-left direction in FIGS. 1 and 2A and the up-down direction in FIG. 2B. Thus, the directions of the magnetic fields of the first and second inductors of the laminated LC filter 1 in the present preferred embodiment are perpendicular to the board on which the LC filter is mounted, and hence influence of radiation of magnetic flux on an adjacently mounted electronic component can be prevented.

Further, with regard to the inductors of the laminated LC filter 1 in the present preferred embodiment, the first inductor includes, as a portion of the line, the via electrodes 29b and 29c extending through a plurality of the dielectric layers in the thickness direction thereof, and preferably has a substantially loop shape. Normally, with regard to the diameter of each via electrode, the cross section is easily made larger than the thickness of a pattern printing electrode, and no edge corner is formed as in a pattern printing electrode. Thus, the resistance value of the via electrode can be decreased. Therefore, an inductor with a great Q value can be obtained, and it is possible to prevent the insertion loss of the laminated LC filter 1.

Further, when it is desired to increase the inductance of each inductor, the increase is possible by increasing the number of the dielectric layer 16 or 20 in FIG. 1 to lengthen the via electrodes and make the loop shape of the inductor large in size. This increase can be made without deteriorating the Q value of the inductor.

Figure 4:
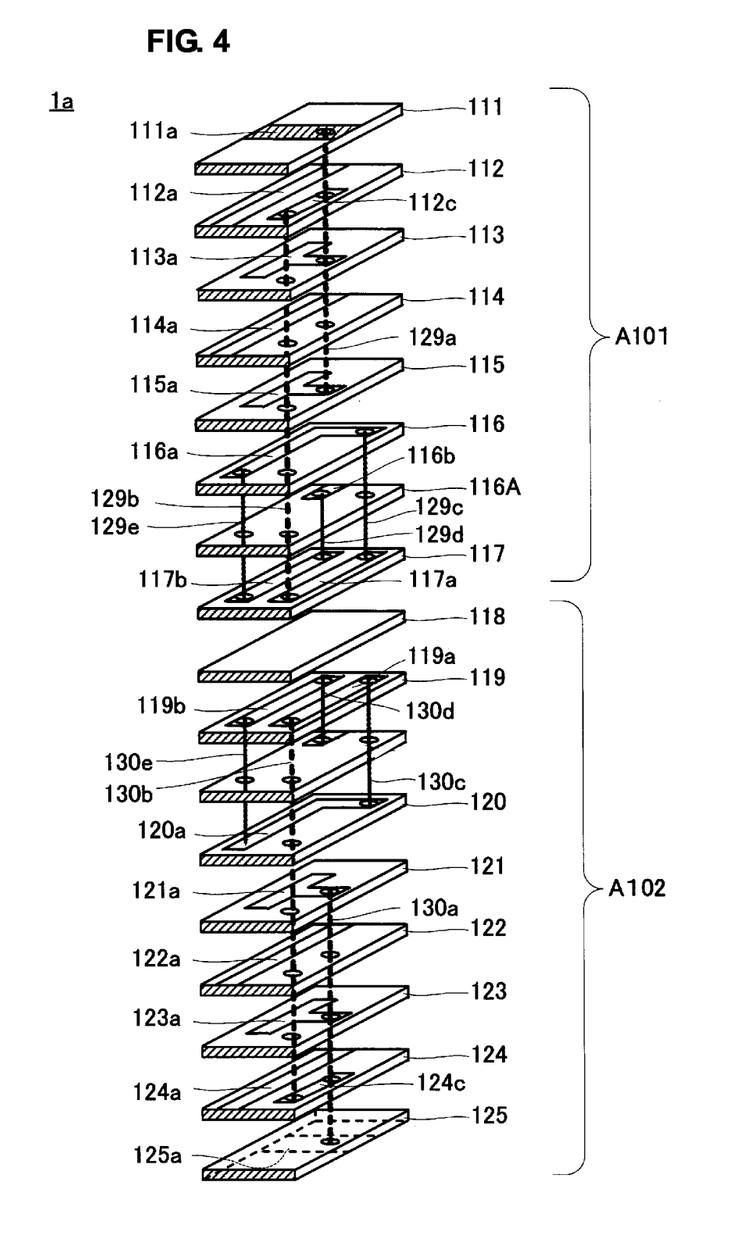
FIG. 4 is an exploded perspective view of a modified example of the laminated LC filter in FIG. 1.

Further, in the laminated LC filter 1, the loop of each inductor preferably has a single-winding structure, but may have a double-winding structure as in a laminated LC filter 1a shown in FIG. 4.

In the laminated LC filter 1a, dielectric layers 111-125, and electrode layers 111a-116a and 121a-125a are laminated, and via electrodes 129a-129e and 130a-130e are provided. The basic manufacturing method and structure of the laminated LC filter 1a and the configurations of capacitors are the same as those in the laminated LC filter 1.

A first inductor of a first block A101 preferably includes a substantially loop-shaped line that extends from a connection point between the inductor electrode layer 112c and the via electrode 129a through the inductor electrode layer 112c, the via electrode 129b, the inductor electrode layer 117a, the via electrode 129c, the inductor electrode 116a, the via electrode 129e, the inductor electrode layer 117b, and the via electrode 129d in order, to a connection point between the via electrode 129d and the ground electrode layer 116b.

A second inductor of a second block A102 is arranged so as to be symmetrical to the first inductor of the first block A101. In addition, a third capacitor preferably includes the facing inductor electrode layers 117a and 119a and the facing inductor electrode layers 117b and 119b.

According to the above configuration, the number of winding of each inductor can be changed to adjust the inductance. In addition, the number of winding of the inductor can be increased further by the arrangement of the electrode layers such as the dielectric layers 116, 116A, and 117 and the via electrodes.

Second Preferred Embodiment

Figure 5:
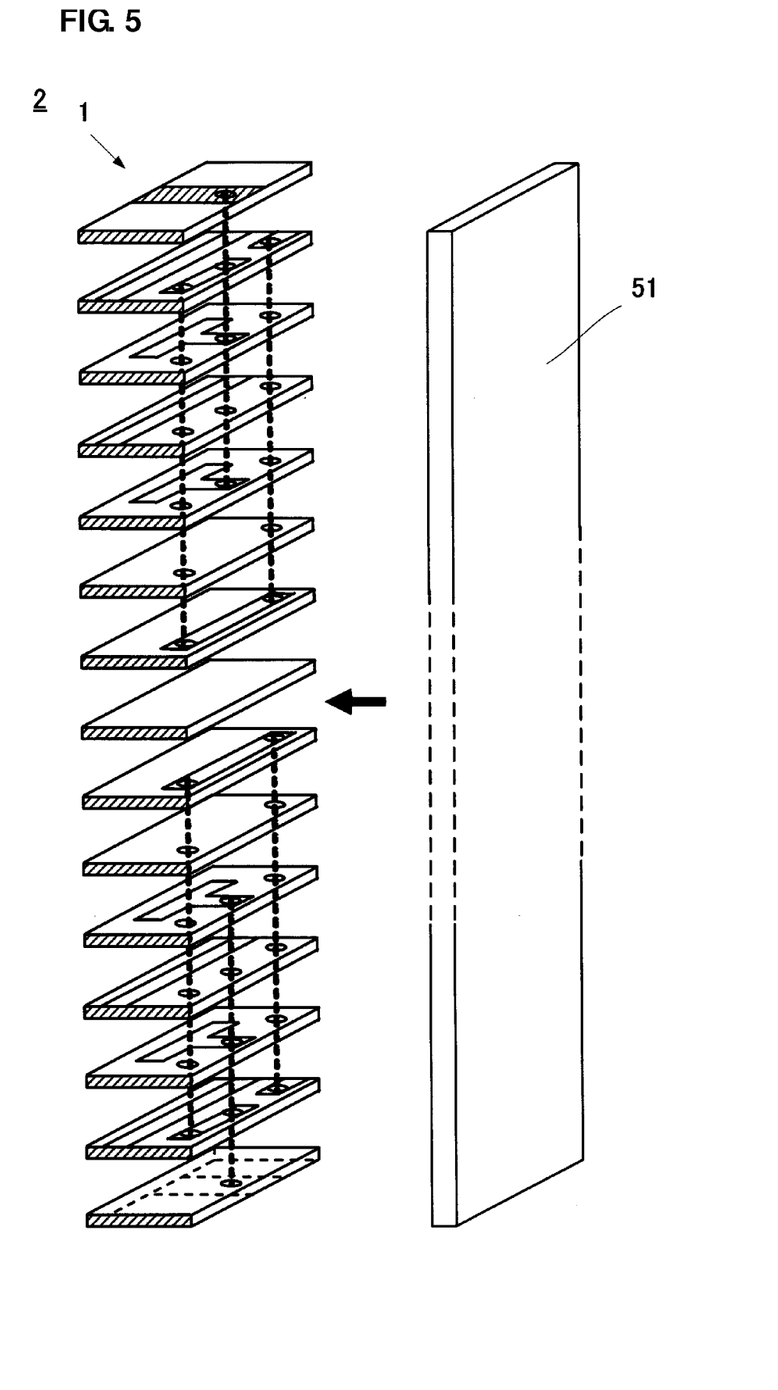
FIG. 5 is an exploded perspective view of a laminate of a laminated LC filter according to a second preferred embodiment of the present invention.
Figure 6A:
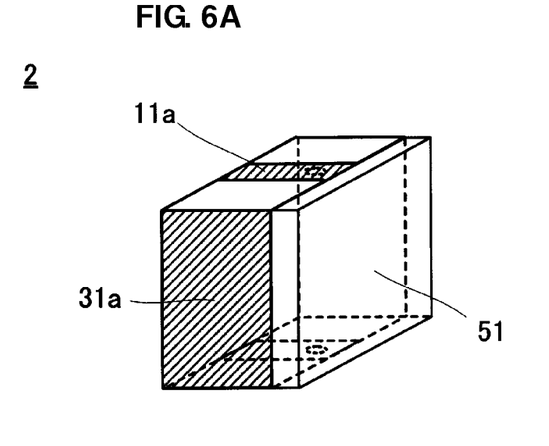
FIGS. 6A to 6C are external perspective views of the laminated LC filter in FIG. 5.
Figure 6B:
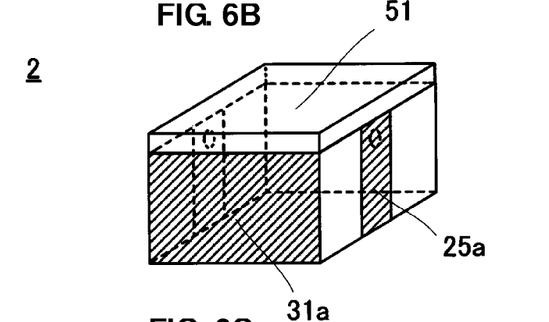
Figure 6C:
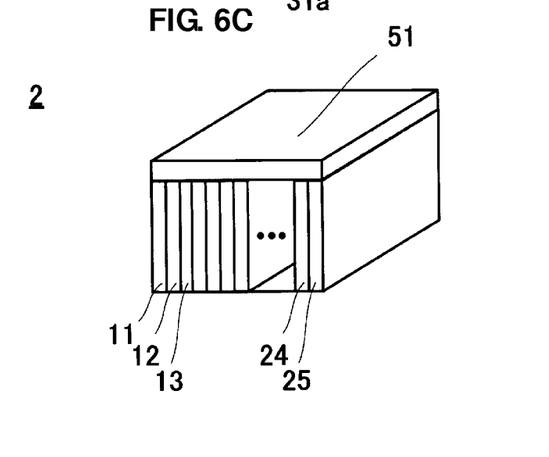

A laminated LC filter 2 is obtained by adding a magnetic layer 51 to the laminated LC filter 1 of the first preferred embodiment 1. FIG. 5 is an exploded perspective view of the laminated LC filter 2, FIG. 6A is an external view of the laminated LC filter 2, and FIG. 6B is an external perspective view of the laminated LC filter 2 in a state where the laminated LC filter is mounted on a mounting board (not shown) such that the board is located on the lower side. FIG. 6C is a schematic diagram schematically illustrating a direction in which the magnetic layer 51 and dielectric layers 11 to 25 are laminated, wherein the mounting board is similarly located on the lower side.

As shown in FIGS. 5 to 6C, in the laminated LC filter 2, the magnetic layer 51 is provided on a surface parallel to the loop surfaces of the first and second inductors of the laminated LC filter 1. The magnetic fields of the inductors are perpendicular to the loop surfaces. Thus, the magnetic layer 51 is present in an area through which the magnetic fields of the first and second inductors pass, and the inductances of these inductors can be increased.

Further, spreading of the magnetic field of the inductor is inversely proportional to the magnitude of the magnetic permeability, and hence the magnetic layer 51 has an effect of preventing spreading of the magnetic field. Thus, in a device in which the laminated LC filter is mounted, the magnetic layer 51 can reduce influence of radiation of magnetic flux on an adjacent electronic component. Meanwhile, due to the effect of preventing spreading of the magnetic flux, coupling of the inductors electromagnetically coupled to each other is made loose, and the electromagnetic coupling between the first inductor L1 and the second inductor L2 is weakened.

Further, due to environmental change or the like, the laminated LC filter 2 receives a bending force in the up-down direction in FIG. 6C. This direction is parallel to the laminated surface of the laminate, and thus there is a high risk that inter-layer separation and a crack will occur due to bending. In this structure, the added magnetic layer 51 is perpendicular to the laminated surface and thus has an effect of preventing inter-layer separation and a crack from occurring.

Third Preferred Embodiment

Figure 7A:
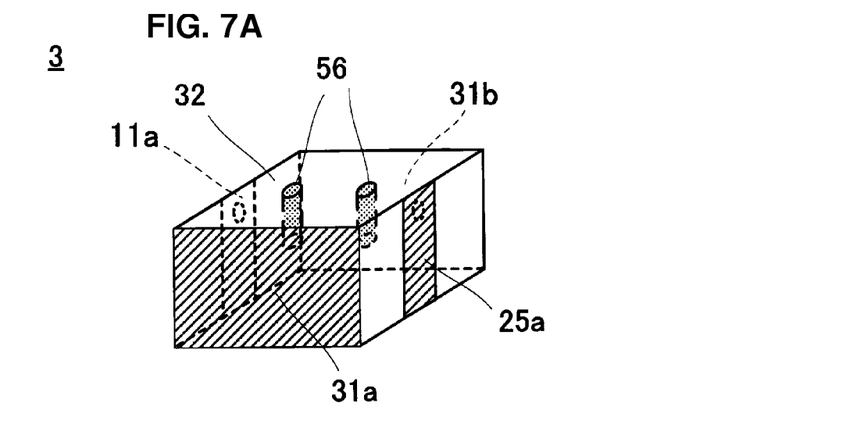
FIGS. 7A to 7C are diagrams illustrating a laminated LC filter according to a third preferred embodiment of the present invention.
Figure 7B:
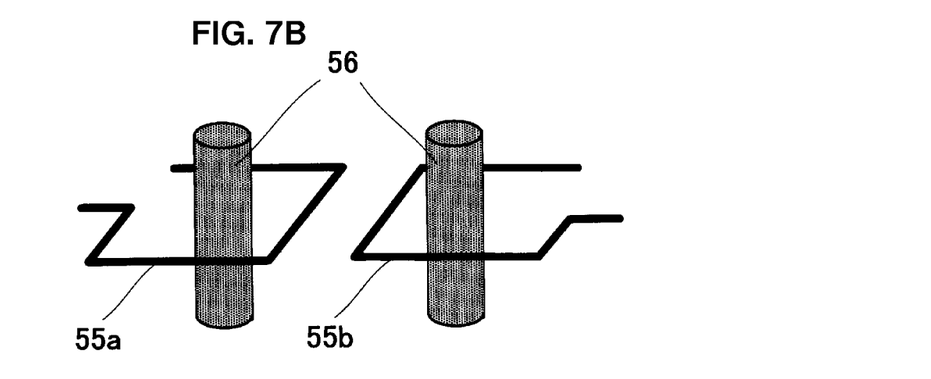

A laminated LC filter 3 is obtained by boring the body of the laminate from the surface 32 side so as to perpendicularly extend through the loop surfaces of the first and second inductors in the laminated LC filter 1 of the first preferred embodiment, and putting a magnetic material therein to form magnetic layers 56. FIG. 7A is an external perspective view of the laminated LC filter 3, and FIG. 7B is an image diagram illustrating a state where the line of the first inductor is a loop 55a, the line of the second inductor is a loop 55b, and the magnetic layers 56 perpendicularly extend through the loop surfaces of these loops.

The magnetic layers 56 are located in areas through which the magnetic fields of the first and second inductors pass, and thus the inductances of these inductors can be increased. In addition, due to the effect of preventing spreading of magnetic flux, the magnetic layers 56 can reduce influence of radiation of magnetic flux on an adjacent electronic component. Meanwhile, as described above, when spreading of magnetic flux is prevented, there is also an influence that electromagnetic coupling between the first inductor L1 and the second inductor L2 is weakened.

Figure 7C:
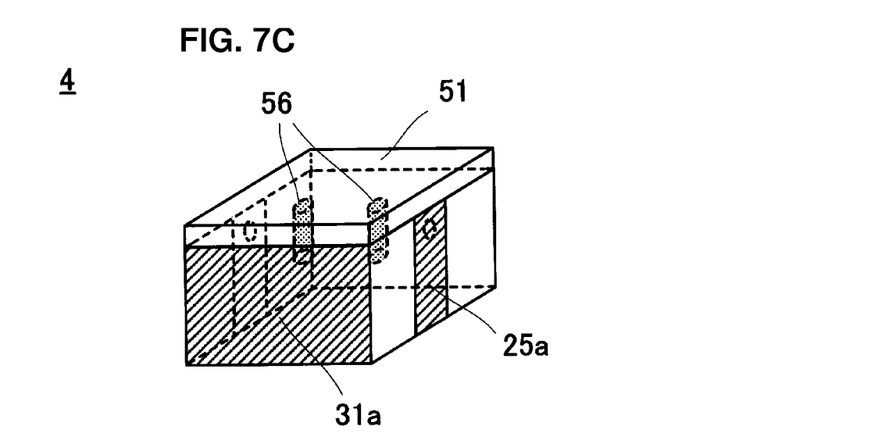

A laminated LC filter 4 is obtained preferably by forming the magnetic layer 51 of the second preferred embodiment on the surface 32 in the laminated LC filter 3. FIG. 7C is an external perspective view of the laminated LC filter 4. As an effect resulting from the addition of the magnetic layer 51 at that time, the same effect as that described in the second preferred embodiment can be obtained.

In the present preferred embodiment of the present invention, the magnetic layers 56 are shown preferably having a substantially cylindrical shape, but their shapes may be substantially rectangular parallelepipeds or substantially polyhedrons and their sizes are not limited as long as they are located within the loops forming the inductors.

Fourth Preferred Embodiment

Figure 8A:
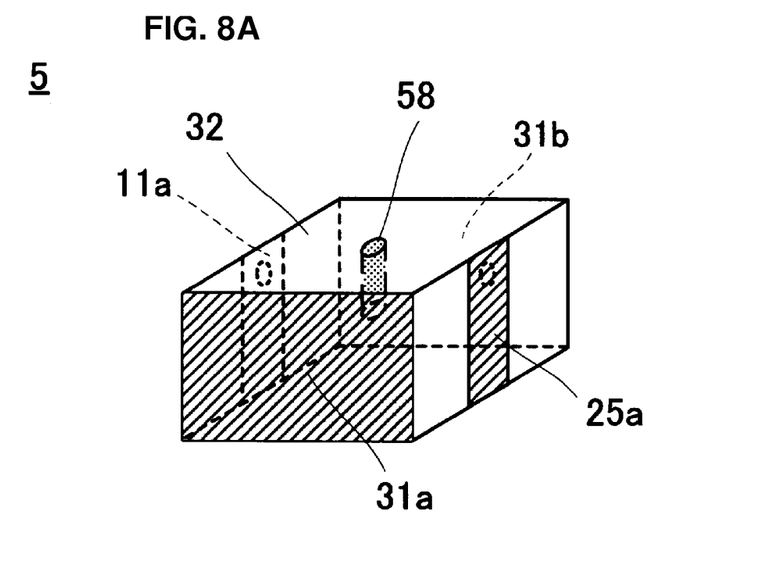
FIGS. 8A and 8B are diagrams illustrating a laminated LC filter according to a fourth preferred embodiment of the present invention.
Figure 8B:
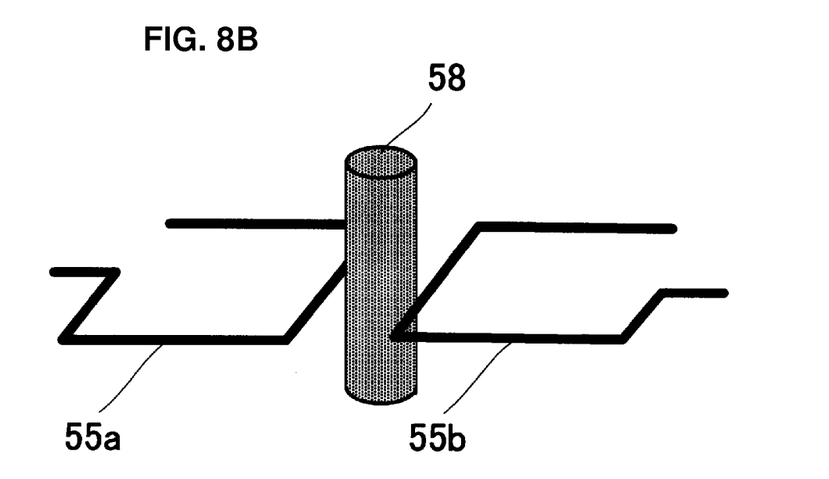

A laminated LC filter 5 is obtained preferably by boring the body of the laminate in the laminated LC filter 1 of the first preferred embodiment so as to extend from the surface 32 between the first and second inductors, and putting a magnetic material therein to form a magnetic layer 58. FIG. 8A is an external perspective view of the laminated LC filter 5, and FIG. 8B is an image diagram illustrating a state where the magnetic layer 58 is provided between the first inductor loop 55*a* and the second inductor loop 55*b*.

Due to the effect of preventing spreading of magnetic flux as described above, the magnetic layer 58 has an effect of weakening the electromagnetic coupling between the first inductor L1 and the second inductor L2 and can be used to adjust the electromagnetic coupling therebetween.

In the laminated LC filter 5, it is possible to use both or at least one of the magnetic layer 51 shown in the second preferred embodiment and the magnetic layers 56 shown in the third preferred embodiment. In this case, the effects of each layer can be obtained.

In the present preferred embodiment, the magnetic layer 58 is shown as preferably having a substantially cylindrical shape, but its shape may be a substantially rectangular parallelepiped or a substantially polyhedron and its size is not limited as long as it is located between the loops defining the inductors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated LC filter comprising:
a laminate including a plurality of dielectric layers, a capacitor electrode layer, a first inductor electrode layer, a ground electrode layer, a pair of input/output electrode layers, and a via electrode extending through the dielectric layers in a thickness direction thereof, and having a substantially rectangular parallelepiped shape;
a first LC resonator including a first capacitor including the capacitor electrode layer and a first inductor including the first inductor electrode layer;
a second LC resonator including a second capacitor and a second inductor including a second inductor electrode layer facing the first inductor electrode layer; and
a third capacitor including the first and second inductor electrode layers;
the first inductor includes the first inductor electrode layer and the via electrode extending through the plurality of dielectric layers in the thickness direction, and has a substantially loop shape;
the first capacitor includes the ground electrode layer and the capacitor electrode layer facing the ground electrode layer; and
one of the pair of input/output electrode layers is disposed on a first outermost surface of the laminate in a direction in which the plurality of dielectric layers are laminated and another one of the pair of input/output electrode layers is disposed on a second outermost surface of the laminate opposite to the first outermost surface of the laminate in the direction in which the plurality of dielectric layers are laminated;
the first and second inductors generate magnetic fields in directions that are perpendicular or substantially perpendicular to loop surfaces thereof; and
the first and second LC resonators are adjacent to each other in the thickness direction.

2. The laminated LC filter according to claim 1, wherein a magnetic layer is located on a surface perpendicular to the direction of the magnetic field of the first inductor among surfaces of the laminate.

3. The laminated LC filter according to claim 1, wherein the first inductor is loop-shaped and a magnetic layer extends through an opening surface of the loop-shaped inductor.

4. The laminated LC filter according to claim 1, wherein the first and second LC resonators are coupled to each other, and a magnetic layer is located between loop-shaped inductors of the first and second LC resonators.

5. The laminated LC filter according to claim 1, wherein a surface parallel to a lamination direction among surfaces of the laminate is a bottom surface.

\* \* \* \* \*